Figure 1:
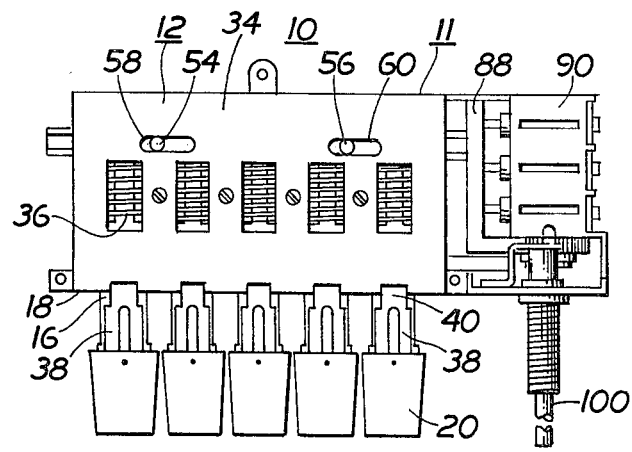

United States Patent [19]

Kantner

[11] 4,205,557
[45] Jun. 3, 1980

[54] INTERLOCKING APPARATUS

[75] Inventor: Robert C. Kantner, Springfield, Pa.

[73] Assignee: TRW, Inc., Cleveland, Ohio

[21] Appl. No.: 827,959

[22] Filed: Aug. 26, 1977

[51] Int. Cl.² .......................... F16H 35/18; H03J 5/32
[52] U.S. Cl. ............................. 74/10.33; 74/483 PB;
200/5 E; 200/5 EA; 334/7
[58] Field of Search .................. 74/10.33, 10.1, 10.27,
74/10 R, 483 PB; 200/5 E, 5 EA, 5 B; 334/7

[56] References Cited
U.S. PATENT DOCUMENTS

| | | | |
|---|---|---|---|
| 2,192,621 | 3/1940 | Radtke | 200/5 EA |
| 2,442,766 | 6/1948 | Garvin | 200/5 E |
| 2,557,480 | 6/1951 | Snyder | 200/5 E |
| 3,463,017 | 8/1969 | Stamm | 74/10.33 |
| 3,544,739 | 12/1970 | Shah | 200/5 E |
| 3,636,776 | 1/1972 | Grandin | 74/10.33 |
| 3,927,283 | 12/1975 | Kumimine | 200/5 E |
| 3,943,779 | 3/1976 | Ganderton | 74/10.33 |
| 4,030,052 | 6/1977 | Pelletien | 74/10.33 |
| 4,144,511 | 3/1979 | Collings | 334/7 |

FOREIGN PATENT DOCUMENTS

| | | | |
|---|---|---|---|
| 815620 | 6/1969 | Canada | 200/5 EA |
| 1651665 | 10/1952 | Fed. Rep. of Germany | 74/10.33 |
| 2154450 | 3/1973 | Fed. Rep. of Germany | 74/10.1 |
| 2455663 | 5/1976 | Fed. Rep. of Germany | 200/5 EA |
| 1577445 | 8/1969 | France | 200/5 E |

OTHER PUBLICATIONS

IBM Technical Disclosure Bulletin, Vol. 13, No. 1, Jun. 1970, p. 230.

Primary Examiner—Charles J. Myhre
Assistant Examiner—Magdalen Moy
Attorney, Agent, or Firm—Jacob Trachtman

[57] ABSTRACT

An interlocking apparatus comprising a plurality of spaced elements each of which is controllably movable to an extended position upon actuation, and control means having a plurality of positions which are alterable for the extension of only respectively determined ones of said elements, said control means being prevented from altering its position while a said element is in its extended position.

46 Claims, 7 Drawing Figures

U.S. Patent Jun. 3, 1980 Sheet 2 of 2 4,205,557

INTERLOCKING APPARATUS

The invention relates to an interlocking apparatus, and more particularly to an apparatus which controls the movement of a plurality of elements, and prevents the extension of some elements while other elements are extended.

The interlocking apparatus of the invention is particularly useful where only selected elements are to be extended or actuated at one time, or in a particular sequence. Thus, the apparatus determines which elements may be extended at a particular time, and prevents other elements from being extended until the extended elements are returned to their retracted positions. The apparatus may be used to allow the extension of any number of elements at one time, or of only one element at a time. Thus, where the elements are push buttons, it may be desirable that certain combinations of push buttons or only one push button is operative at one time, while others are not. Similarly, the push buttons can be controlled so that they can only be operated in a particular sequence. Such sequences or combinations, are useful in connection with devices which require controlled or programmed manipulation to obtain proper operation.

Another application for the interlocking apparatus, in connection with which the invention is described herein is in connection with a push button tuner used for automobile radios or for television sets. For such use, it is desirable to actuate only one pushbutton at a time, since the simultaneous actuation of a plurality of push buttons, results in improper tuning, and may cause damage to the tuner mechanism.

Although the prior art has provided interlocking devices which prevent actuation of more than one element at a time, the present interlocking apparatus provides a highly simplified structure including a minimum number of components allowing the effective and efficient control of the extension of actuated elements and has a flat configuration requiring a minimum of space for its operation.

It is, therefore, an object of the invention to provide a new and improved interlocking apparatus which controls the actuation and extension of a plurality of elements for sequential operation of single or multiple elements.

Another objective of the invention is to provide a new and improved interlocking apparatus which is of reduced size and has a flat configuration allowing its utilization in a minimum of space.

Another object of the invention is to provide a new and improved interlocking apparatus which is maintenance free and easily fabricated and embodied in various devices requiring controlled actuation.

The above and many other objects of the invention are achieved by the interlocking apparatus of the invention which comprises a plurality of spaced elements which are respectively controllably movable to an extended position upon actuation, and a control means having a plurality of positions which are alterable for allowing the extension of only respectively determined ones of the elements. The control means is prevented from altering its position while an element is in its extended position and includes a plurality of openings, each corresponding with and being positioned proximate to the end of a respective one of the plurality of elements. The openings of the control means are spaced from each other for allowing the receipt by corresponding openings of only such elements which are respectively determined or selected by the position of the control means. The interlocking apparatus includes positioning means providing camming surfaces for engagement by the ends of the elements upon their actuation for positioning the control means and allowing movement of an actuated element through its corresponding opening to its extended position.

Although many other objects and applications for the invention will be obvious, the invention is particularly described in connection with a low profile tuner adapted for use in automobiles, of the type described in U.S. Pat. No. 3,943,779 issued Mar. 16, 1976 entitled "Pre-Set Positioning Device." The pre-set positioning device has a plurality of push button elements, and may be preset so that the actuation of each push button results in the tuning of a selected station. The actuation of more than one push button at one time is undesirable and may result in damaging the operating mechanism.

Figure 2:
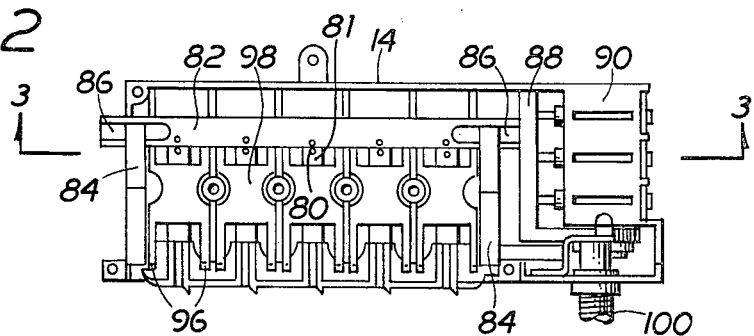
Figure 3:
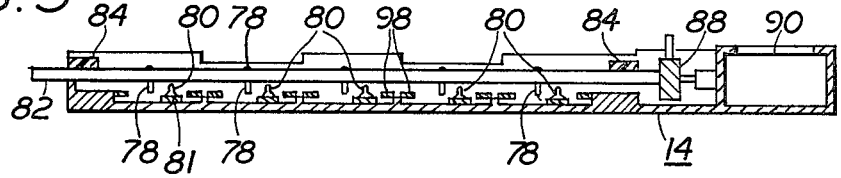
Figure 6:
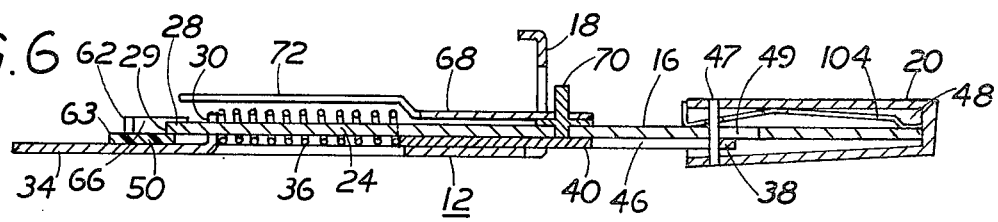
Figure 7:
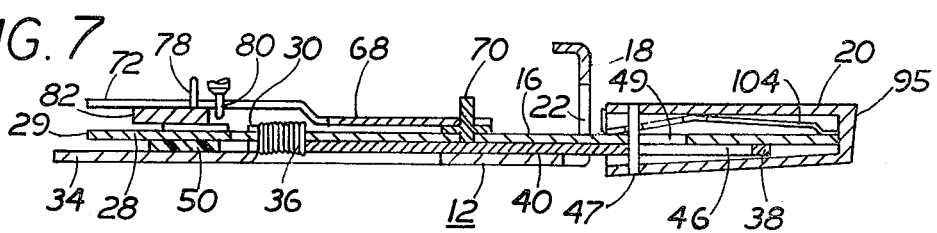
Figure 4:
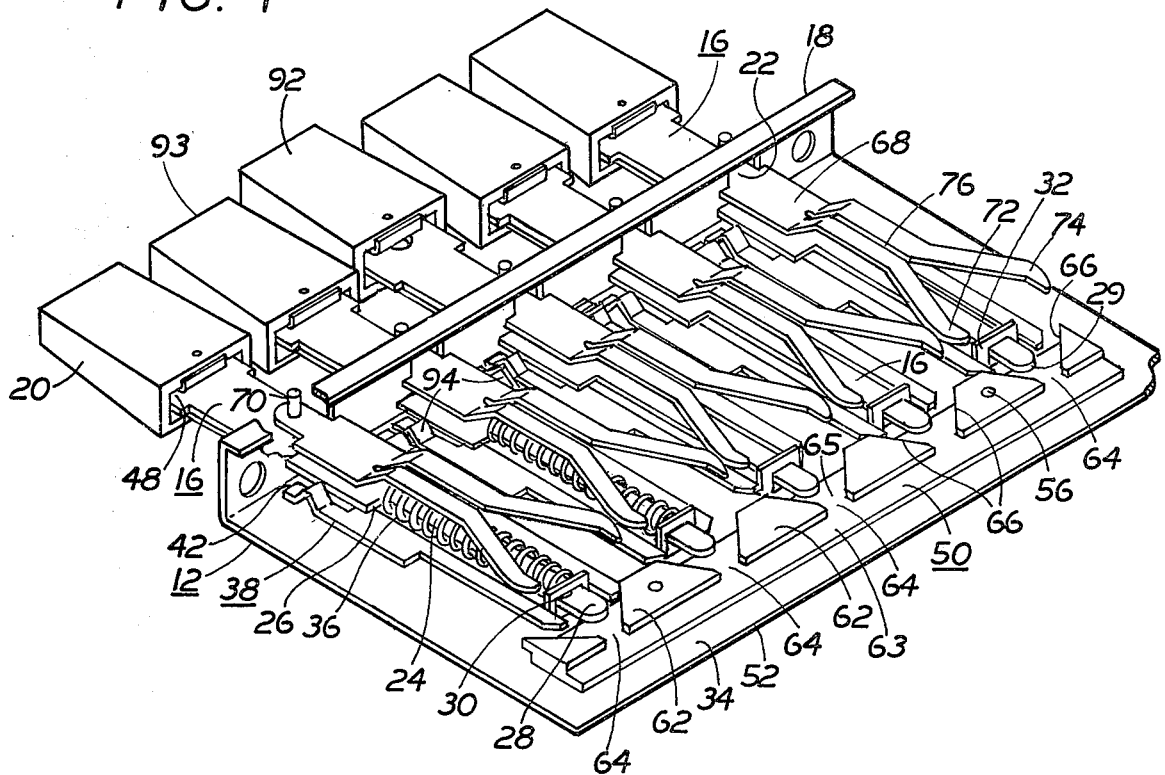
Figure 5:
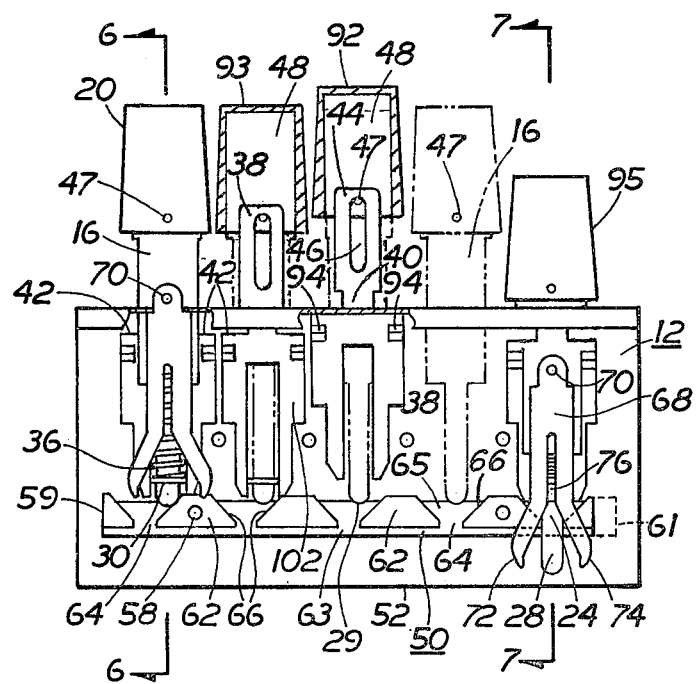

The foregoing and other objects of the invention will become more apparent as the following detailed description of the invention is read in conjunction with the drawing, in which:

FIG. 1 is a top plan view of a low profile automobile tuner embodying the invention, FIG. 2 is a top plan view of the tuner of FIG. 1, with its top cover removed, FIG. 3 is an enlarged sectional view taken on the line 3—3 of FIG. 2, FIG. 4 is an enlarged perspective view of the inside of the cover portion of the tuner shown in FIG. 1, FIG. 5 is a top plan view of FIG. 4 with portions removed and broken away and shown in dashed lines, illustrating the push button elements in various positions, FIG. 6 is an enlarged sectional view taken on the line 6—6 of FIG. 5, illustrating a push button element in its normal unextended or retracted position, and FIG. 7 is an enlarged sectional view taken on line 7—7 of FIG. 5 of a push button element in its fully extended position.

Like reference numerals designate like parts throughout the several views.

Refer to the figures which illustrate a low profile tuner 10 embodying the invention having a substantially rectangular housing 11 with a top cover portion 12 and a bottom portion 14. A plurality of five elements 16, each have a forward end projecting from the front vertical wall 18 of the top cover portion 12, which receives a push button 20. The elements 16 which may be formed from a thin metal sheet are elongated with their longitudinal axes arranged parallel and equally spaced from each other. The elements 16 have flat horizontal surfaces lying in the same plane which is parallel to the horizontal top plate 34 of the cover portion 12 of the housing. Each element 16 is slidably received through a respective horizontal opening 22 in the wall 18 into the housing 11, and is provided within the housing 11 with an elongated portion 24 of reduced width forming a shoulder 26. Each of the extending ends 28 of the elements 16 is slidably received through a guide opening 30 provided by a respective tab 32. The tabs 32 are formed integrally with and extend perpendicularly from the horizontal top plate 34 of the top cover portion 12. A coiled spring 36 is received about the reduced portion 24 and positioned between the shoulder 26 of each element 16 and its guide tab 32 for exerting a force urging the slide elements toward their normal retracted positions shown in FIGS. 1 and 6. Each slide element 16 is conditionally movable in its longitudinal direction between its normal retracted position of FIG. 6 and its fully extended position shown in FIG. 7.

A plurality of locking plates 38 are provided, one of which is positioned under each of the slides 16 as shown in FIGS. 4 and 5. Each locking plate has a narrowed portion 40 extending through a respective one of the openings 22 in the wall 18 below its associated slide 16. The narrowed portion 40 forms a shoulder 42 located within the housing 11 which limits the outward movement of the locking plate 38 by contacting the inner surface of wall 18 as seen in connection with push button 92 in FIGS. 4 and 5. This also results in limiting the outward movement of the slide element 16 associated with the locking plate 38 as follows. The narrowed end portion 44 of the locking plate 38 has an elongated opening 46 which movably receives therein a pin 47 which is fixed in and extends through the push button 20. This allows the end portion 44 of the lock plate 38 to slide into and out of the opening 48 of button 20. The pin 47 also extends through an enlarged opening 49 in the end of the element 16 received in the opening 48 of the push button, linking together the push button 20 with the end of its slide element 16 for limited movement against a detent spring 104 between locked and unlocked positions (see FIG. 6).

A substantially rectangular elongated control member 50 is slidably secured with the top cover portion 12 of the housing 11 parallel to the rear edge 52 along the inside surface of the horizontal top plate 34. The member 50 is positioned proximate to the ends 28 of the slide elements 16, and is movable in the direction transverse to the longitudinal direction of movement of the elements 16. A pair of member guide pins 54 and 56, at opposite ends of the member 50 extend through and slidably engaged the slots 58 and 60 (see FIG. 1) in the top plate 34. The slots 58 and 60 are colinear and of a predetermined length, guiding the control member 50 for limited movement in a transverse linear direction between left and right terminal positions 59 and 61.

The control member 50 is provided with a plurality of trapezoidal sections 62 extending above and integral with a base section 63 contacting the surface of the plate 34. Each adjacent pair of trapezoidal sections 62 form an opening 64 between them, providing a plurality of five openings 64, each positioned proximate to the end of a corresponding one of the elements 16. The sloped sides 66 of each adjacent pair of trapezoidal sections 62 provide an enlarged entrance way 65 to an opening 64 for its corresponding slide element 16. The linear inclined sides 66 are tapered to decrease the size of the entrance way 65 in the direction toward the opening 64. The end 28 of each element is received partially into the entrance way 65 of its associated opening 64 above and slightly overlapping the base section 63 of the member 50 when the element is in its normal retracted position.

In operation, with all of the slide elements 16 in their normal retracted positions, the actuation of a push button 20, results in the inward movement of its slide element 16 into the housing 11 towards its extended position. The end 28 of the slide element 16, as it extends, contacts an inclined side 66 of an associated trapezoidal section 62 of the control member 50. The projecting portion of the end 28 of the element 16 may be rounded as shown at 29 in FIG. 5 to provide a smoother sliding contact with the camming sides 66 of the control member 50 for minimizing the force needed for positioning and aligning the control member 50. Further movement in the inward or extending direction of the slide element 16, exerts a force against the surface 66 having a component slidably moving the control member in the transverse direction. The movement is in a direction for aligning the end 28 of the element 16 with its corresponding opening 64. The control member 50, thus, by means of the camming action provided by the side 66 with the slide 16, is moved until the end 28 of the slide 16 is aligned with its corresponding opening. This allows the full extension of the element 16 through the opening 64 of the control member 50 with its further movement as illustrated by push button 95 of FIG. 5 and also as shown in FIG. 7.

Upon the removal of the actuating force on a button 20, the spring 36 moves the slide element 16 back toward its normal retracted position. This results in the retraction of the end 28 of the slide element 16 from its corresponding opening 64 of the control member 50. The actuation, in turn, of each of the buttons 20 provide a similar camming action resulting in the aligning movement of the control member 50, so that the actuated element 16 can be extended through its corresponding opening 64 to its fully extended position.

The extension of any one of the slide elements 16 through its corresponding opening 64, locks the control member 50 against transverse movement. Since the openings 64 are spaced a distance apart which is slightly different from the spacing between the corresponding ends 28 of the slide elements 16, only one of the elements 16 can be aligned with its opening 64 at any one time. After the control member 50 is locked by an element 16, the actuation of any one or more of the remaining push buttons 20 results in the extension of their elements 16 until their ends 28 contact their respective camming surfaces or sides 66 of the control member 50. However, since the control member 50 is locked and cannot be moved, the ends 28 of such elements cannot effect alignment with their respective openings, and therefore, are prevented from being fully extended.

However, upon the retraction of an extended element 16, the control member 50 is disengaged and unlocked, so that it may be moved to a new position by the camming action provided by the actuation of another push button 20. In the embodiment of the tuner 10 illustrated, the slide elements 16 are equally spaced from each other, so that the distances between the adjacent ends 28 of the elements 16 are equal. Although the longitudinal spacing between adjacent openings is also equal, it is offset from the spacing between the ends 28 of the elements 16. This results in the distance between adjacent opening 64 being greater than the distance between adjacent ends 28 of the elements 16 in their normal unextended positions. This arrangement provides that only one of the ends 28 of an element may be aligned with its opening at one time. Of course, the spacings between the elements or openings need not be equal as illustrated, and the slide elements 16 and openings 64 may also be arranged so that a plurality of elements may be aligned at one time with corresponding openings and extended therethrough, while preventing the remaining elements from being extended for a particular position of the control member 50.

A comparator 68 overlies each slide element 16 as seen in FIGS. 4 and 5, and has an end attached thereto by a pin 70 which allows relative pivotal movement. The other end of the comparator 68 has two splayed prongs 72 and 74, and a longitudinally extending throat 76 at the junction of the two prongs 72 and 74. As the element 16 moves toward its extended position, the comparator 68 moves with it and the splayed prongs 72 and 74 receive therebetween an associated one of a plurality of spaced locator pins 78 which depends from a locator bar 82, and an associated reference pin 80 projecting upwardly from the bottom portion 14 of the housing 11 (see FIG. 3). With the slide element 16 fully extended, the locator pin 78 and its associated reference pin 80, are received into the throat 76 of the comparator 68 and aligned with each other (see FIG. 7). If the reference pin 80 is fixed with the housing 11, the alignment of the locator pin 78 with it, results in the transverse movement of the locator bar 82. The movement of the locator bar 82 is guided by a pair of end members 84 which extend into longitudinal slots 86 at the ends of the locator bar 82 shown in FIG. 2. The locator bar 82 joins a transverse element 88 which connects with plurality of tuning coils 90, and controls the tuning mechanism 90. In this manner, the extension of a particular push button element 16, results in a corresponding pair of locator and reference pins being aligned for making a tuning selection.

The reference pins 80 can be controllably fixed with respect to the bottom section 14 of the housing 11, for determining the various stations which may be selected by operation of the push buttons. The reference pins 80 may be reset to different positions under the control of the user. This is accomplished by pulling outwardly on a button 20, so that it moves from its normal locked detent position shown by button 93 of FIG. 5 to its unlocked detent position shown by button 92 in FIGS. 4 and 5 which is beyond its normal unextended position. This action also moves the lock plate 38 of button 92 in the direction outwardly from the housing 11 as seen in FIG. 5. This outward movement of the lock plate 38 results in the displacement of its raised clamping projections 94 from the elevated lever ends 96 of a clamping plate 98, to assume its unlocked position. With pressure removed from the clamping plate 98, its associated reference pin 80 which is mounted on a pivoted arm 81 is released for movement and repositioning with respect to the bottom section 14 of the housing 11.

The tuner 10 may now be tuned to a desired station by turning the mechanical tuning shaft 100 which repositions the locator bar 82. The actuation of the button 92 extends the element 16 and its associated comparator 68. This results in alignment of the movable reference pin 80 with its associated locator pin 78 which has been positioned to tune the selected station. The continued movement of the button 92 results in its pin 47 engaging the locking plate 38 at the end of its opening 46, and the movement in the same direction of the locking plate 38 to its locked position as shown at 102 in FIG. 5. At this time, the raised projection 94 of the locking plate 38 engage the elevated ends 96 of the pressure plate 98 locking the reference pin 80 in the aligned position. At the same time, the button 20 snaps (as shown by button 95 in FIG. 5) into its normal locked detent position against the end of detent spring 104 as shown in FIG. 7 for maintaining the locking plate 38 in its normal locked position. After the reference pin 80 is thus set and fixed, any subsequent actuations of a button 20, result in the realignment with it of its locator pin 78, thereby, moving the bar 82 to the tuning position for the selected station or frequency.

From the description of the operation of the low profile tuner 10 it is apparent that without the interlocking actions of the push button elements 16 and control member 50, more than one control element 16 could be actuated and extended at one time. Such operation can damage and result in the malfunctioning of the tuner 10 by the application of excessive force, bending, spreading or otherwise misaligning the comparator and other components of the mechanism. The actuation of more than one push button, is also undesirable since such action does not contribute to proper operation in either selecting or resetting selected frequencies or stations. The interlocking apparatus, for the particular embodiment illustrated, allows the operation of only one push button at a time, while locking out and preventing operation of any other push button until the operated button is released. By such action the apparatus also prevents jamming and destruction of the tuning mechanism by intentional or unintentional application of forces for which the apparatus is not designed.

Of course, the interlocking apparatus disclosed has many other applications which are not limited to that specifically described herein and additional modifications and variations will be obvious to those skilled in the art to meet the particular design circumstances, but without substantial departure from the essence of the invention.

What is claimed is:

1. An interlocking apparatus comprising a plurality of at least three spaced elements each of which is controllably movable to an extended position upon actuation, and a single unitary control means having a plurality of positions which are alterable for respectively permitting the extension of only certain ones of said elements and having at least three positions each of which permits the extension of a respective different one of said elements, said control means being prevented from altering its position while a said element is in its extended position.

2. The apparatus of claim 1 in which said control means includes engaging means for receiving said elemens upon their movement to their extended positions, only said elements respectively determined by the position of said control means being received by said engaging means.

3. The apparatus of claim 2 in which said elements each have an end which is receivable by said control means, and the engaging means of said control means moves transversely with respect to the ends of said elements.

4. The apparatus of claim 3 in which the engaging means of said control means includes a plurality of openings each corresponding with and being positioned proximate to the end of a respective one of said plurality of elements.

5. The apparatus of claim 4 in which the openings of said control means are spaced from each other for allowing receipt by their corresponding openings of only the elements which are respectively determined by the position of said control means, while preventing receipt by their corresponding openings of any of the other of said elements.

6. The apparatus of claim 5 in which each of the plurality of positions of said control means respectively determines only one of said plurality of elements, and the openings of said control means are spaced for allowing receipt by its corresponding opening of only the element which is respectively determined by the position of the control means.

7. The apparatus of claim 6 in which said elements are arranged with their ends respectively adjacently positioned, each of the adjacent ends of said elements are equally spaced from each other when they are in their unextended positions, and the adjacent openings of said control means corresponding to the adjacent ends of said elements are equally spaced from each other, the spacing of the adjacent ends of the elements being different from the spacing of the corresponding openings of said control means.

8. The apparatus of claim 7 in which the adjacent ends of the elements have a spacing which is smaller than the spacing of the corresponding openings of said control means.

9. The apparatus of claim 6 in which said elements are parallel elongated members which are extendable in their respective longitudinal directions, and said control means is a rod which extends and is positionable in a direction transverse to said elements.

10. The apparatus of claim 1 which includes means for positioning said control means to one of its plurality of positions upon actuation of one of said elements.

11. The apparatus of claim 10 in which when none of said elements is in its extended position, said positioning means upon the actuation of one of said elements positions said control means to its respective position allowing extension of the actuated one of said elements.

12. The apparatus of claim 11 in which said elements each have an end, and said control means includes engaging means for receiving the ends of said elements upon their extention.

13. The apparatus of claim 12 in which the engaging means of said control means includes a plurality of openings each corresponding with and being positioned proximate to the end of a respective one of said plurality of elements, the openings of said control means being spaced from each other for allowing receipt by their corresponding openings of the ends of only the respective ones of said elements determined by the position of the control means, and said positioning means includes camming means for engagement by the ends of said elements for positioning said control means.

14. The apparatus of claim 13 in which said camming means includes an enlarged entrance way to each of the openings of said control means which reduces in size in the direction toward its opening providing a camming surface for engaging the end of its corresponding element upon actuation for positioning said control means for alignment with and for receipt of the end of said element by its opening.

15. The apparatus of claim 14 in which the openings of said control means are spaced for allowing receipt of only the element which is aligned with its corresponding opening.

16. The apparatus of claim 15 in which said elements are arranged with their ends respectively adjacently positioned, each of the adjacent ends of said elements being equally spaced from each other when they are in their unextended positions, and the adjacent openings of said control means corresponding to the adjacent ends of said elements are equally spaced from each other, the spacing of the adjacent ends of the elements being different from the spacing of the corresponding openings of said control means.

17. The apparatus of claim 16 in which the adjacent ends of the elements have a spacing which is smaller than the spacing of the corresponding openings of said control means.

18. The apparatus of claim 15 in which said elements are parallel elongated members which are extendable in their respective longitudinal directions, and have rounded ends for engaging the camming means of their corresponding openings, and said control means is a linear rod which extends and is positionable in a direction transverse to said elements.

19. The apparatus of claim 18 in which each of said elements is a push button slide of a radio tuning device, and the control means is a lock out mechanism preventing the extention of more than one slide at a time and the extention of a subsequent slide until the control means is disengaged by a previously extended slide.

20. The apparatus of claim 19 in which said elements are arranged with their ends respectively adjacently positioned, each of the adjacent ends of said elements are equally spaced from each other when they are in their unextended positions, and the adjacent openings of said control means corresponding to the adjacent ends of said elements are equally spaced from each other, the spacing of the adjacent ends of the elements being different from the spacing of the corresponding openings of said control means.

21. The apparatus of claim 20 in which the rod of said control means is movable transverse to the ends of said elements between first and second terminal positions with the ends of each of said members positioned respectively within the enlarged entrance way of its corresponding opening for engaging said camming means upon actuation of said elements.

22. The apparatus of claim 21 in which the rod of said control means includes a slidable rectangular base member with a plurality of superimposed trapezoidal sections providing the plurality of spaced openings with entrance ways having tapered camming surfaces, and said push button elements each have a spring means for urging them to assume their unextended positions.

23. The apparatus of claim 19, including radio tuning means actuated by said push button slides for being tuned to predetermined respective frequencies.

24. A radio apparatus including tuning means for selecting a signal frequency, a plurality of at least three spaced push button slide elements each of which is controllably movable to an extended position upon actuation and retracted for setting said tuning means to a predetermined respective frequency, and a unitary control means having a plurality of positions which are alterable for permitting the extention of only a respectively determined one of said elements, said control means being prevented from altering its position while a said slide element is in its extended position.

25. The apparatus of claim 24 which includes means for positioning said control means to one of its plurality of positions upon actuation of one of said elements.

26. The apparatus of claim 25 in which when none of said elements is in its extended position, said positioning means upon the actuation of one of said elements positions saod control means to its respective position allowing extension of the actuated one of said elements.

27. The apparatus of claim 26 in which said elements each have an end, and said control means includes engaging means for receiving the ends of said elements upon their extention.

28. The apparatus of claim 27 in which the engaging means of said control means includes a plurality of openings each corresponding with and being positioned proximate to the end of a respective one of said plurality of elements, the openings of said control means being spaced from each other for allowing receipt by their corresponding openings of the ends of only the respective ones of said elements determined by the position of the control means, and said positioning means includes camming means for engagement by the ends of said elements for positioning said control means.

29. The apparatus of claim 28 in which said camming means includes an enlarged entrance way to each of the openings of said control means which reduces in size in the direction toward its opening providing a camming surface for engaging the end of its corresponding element upon actuation for positioning said control means for alignment with and for receipt of the end of said element by its opening.

30. The apparatus of claim 29 in which the openings of said control means are spaced for allowing receipt of only the element which is aligned with its corresponding opening.

31. The apparatus of claim 30 in which said elements are arranged with their ends respectively adjacently positioned, each of the adjacent ends of said elements being equally spaced from each other when they are in their unextended positions, and the adjacent openings of said control means corresponding to the adjacent ends of said elements are equally spaced from each other, the spacing of the adjacent ends of the elements being different from the spacing of the corresponding of said control means.

32. The apparatus of claim 31 in which the adjacent ends of the elements have a spacing which is smaller than the spacing of the corresponding openings of said control means.

33. The apparatus of claim 30 in which said elements are parallel elongated members which are extendable in their respective longitudinal directions, and have rounded ends for engaging the camming means of their corresponding openings, and said control means is a linear rod which extends and is positionable in a direction transverse to said elements.

34. The apparatus of claim 33 in which the rod of said control means includes a slidable rectangular base member with a plurality of superimposed trapezoidal sections providing the plurality of spaced openings with entrance ways having tapered camming surfaces, and said push button elements each have a spring means for urging them to assume their unextended positions.

35. The apparatus of claim 24, in which said tuning means includes a bar which is movable to selected positions in a direction transverse to said elements, and a plurality of tuning coils controlled by the position of said bar for tuning said tuning means to a selected frequency, each of said elements upon its actuation to its extended position actuating said bar to a respective selected position for tuning said tuning means.

36. The apparatus of claim 24, in which said elements are normally in their unextended positions, and which includes means for urging said elements into their normal positions.

37. The apparatus of claim 20 including radio tuning means actuated by said push button slides for being tuned to predetermined respective frequencies.

38. The apparatus of claim 21 including radio tuning means actuated by said push button slides for being tuned to predetermined respective frequencies.

39. The apparatus of claim 22 including radio tuning means actuated by said push button slides for being tuned to predetermined respective frequencies.

40. The apparatus of claim 26 in which said tuning means includes a bar which is movable to selected positions in a direction transverse to said elements, and a plurality of tuning coils controlled by the position of said bar for tuning said tuning means to a selected frequency, each of said elements upon its actuation to its extended position actuating said bar to a respective selected position for tuning said tuning means.

41. The apparatus of claim 28 in which said tuning means includes a bar which is movable to selected positions in a direction transverse to said elements, and a plurality of tuning coils controlled by the position of said bar for tuning said tuning means to a selected frequency, each of said elements upon its actuation to its extended position actuating said bar to a respective selected position for tuning said tuning means.

42. The apparatus of claim 31, in which said tuning means includes a bar which is movable to selected positions in a direction transverse to said elements, and a plurality of tuning coils controlled by the position of said bar for tuning said tuning means to a selected frequency, each of said elements upon its actuation to its extended position' actuating said bar to a respective selected position for tuning said tuning means.

43. The apparatus of claim 34 in which said tuning means includes a bar which is movable to selected positions in a direction transverse to said elements, and a plurality of tuning coils controlled by the position of said bar for tuning said tuning means to a selected frequency, each of said elements upon its actuation to its extended position actuating said bar to a respective selected position for tuning said tuning means.

44. The apparatus of claim 26 in which said elements are normally in their unextended positions, and which includes means for urging said elements into their normal positions.

45. The apparatus of claim 28 in which said elements are normally in their unextended positions, and which includes means for urging said elements into their normal positions.

46. The apparatus of claim 31 in which said elements are normally in their unextended positions and which includes means for urging said elements into their normal positions.

* * * * *